US010067212B2

(12) United States Patent
Stemmer

(10) Patent No.: US 10,067,212 B2
(45) Date of Patent: Sep. 4, 2018

(54) DYNAMIC METHOD AND APPARATUS FOR RADIAL ACQUISITION OF MAGNETIC RESONANCE DATA

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 483 days.

(21) Appl. No.: 14/820,869

(22) Filed: Aug. 7, 2015

(65) Prior Publication Data

US 2016/0041242 A1 Feb. 11, 2016

(30) Foreign Application Priority Data

Aug. 7, 2014 (DE) .......................... 10 2014 215 652

(51) Int. Cl.
*G01V 3/00* (2006.01)
*G01R 33/563* (2006.01)
*G01R 33/48* (2006.01)
*G01R 33/56* (2006.01)

(52) U.S. Cl.
CPC ... *G01R 33/56308* (2013.01); *G01R 33/4824* (2013.01); *G01R 33/5601* (2013.01)

(58) Field of Classification Search
USPC .......................................................... 324/309
See application file for complete search history.

(56) References Cited

U.S. PATENT DOCUMENTS

| 2008/0012563 A1* | 1/2008 | Weiss | G01R 33/4824 324/307 |
| 2016/0025829 A1* | 1/2016 | Koktzoglou | G01R 33/4824 324/309 |
| 2016/0334488 A1* | 11/2016 | Bieri | G01R 33/4824 |
| 2017/0307703 A1* | 10/2017 | Wiesinger | G01R 33/3854 |
| 2017/0307711 A1* | 10/2017 | Wundrak | G01R 33/5614 |

OTHER PUBLICATIONS

Magnusson. et al; "3D Magnetic Resonance Imaging of the Human Brain—Novel Radial Sampling, Filtering and Reconstruction"; Proc of the 12th IASTED International Conference on Signal and Image Processing pp. 710-042-((2010;).

(Continued)

*Primary Examiner* — Rodney Fuller
(74) *Attorney, Agent, or Firm* — Schiff Hardin LLP

(57) ABSTRACT

In method for determining a radial k-space trajectory, having multiple spokes, of an MR control sequence, a first whole number (N) is selected from a first subset of whole numbers. A first constant angular increment (d$\Phi$) between respective spokes of the radial k-space trajectory that are spatially adjacent in k-space is determined as the quotient of $\pi$ and the first whole number N. Subsequently, a second constant angular increment ($\Delta$k*d$\Phi$) between spokes of the radial k-space trajectory that are measured sequentially in time is determined as the product from a second whole number ($\Delta$k) and the first constant angular increment d$\Phi$, wherein the second whole number $\Delta$k is determined from a second subset of whole numbers. The first subset of whole numbers and/or the second subset of whole numbers are/is the set of prime numbers.

12 Claims, 6 Drawing Sheets

(56) References Cited

OTHER PUBLICATIONS

Winkelmann et al; "An Optimal Radial Profile Order Based on the Golden Ratio for Time-Resolved MRI"; IEEE Transactions on Medical Imaging 2007; vol. 26; No. 1; pp. 68-76, (2007).
Magnusson et al; "A 3D-plus-time radial-Cartesian hybrid sampling of k-Space with high temporal resolution and maintained image quality for MRI and fMRI"; Proc. Intl. Soc. Mag. Reson. Med.; vol. 19; p. 2851; (2011).

* cited by examiner

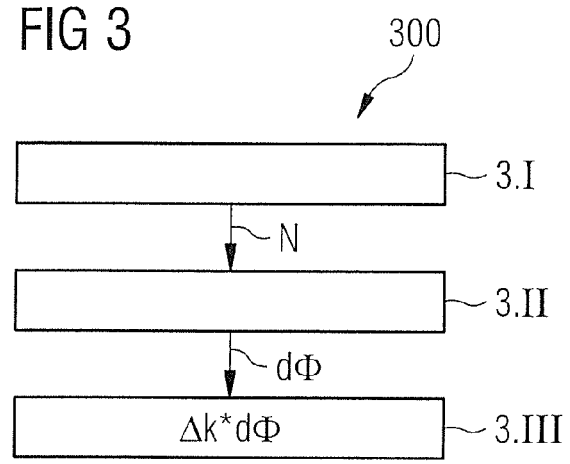
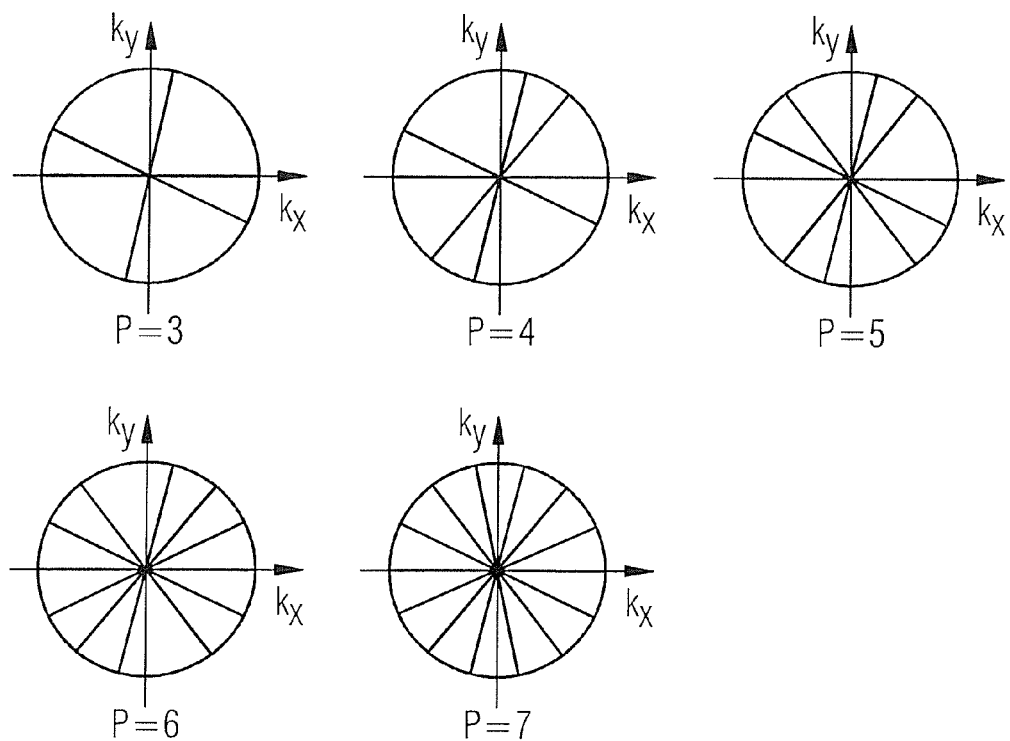

FIG 6

| PZ<1000 | FZ<1000 |
|---|---|
| 2, 3, 5, 7, 11, 13, 17, 19, 23, 29, 31, 37, 41, 43, 47, 53, 59, 61, 67, 71, 73, 79, 83, 89, 97, 101, 103, 107, 109, 113, 127, 131, 137, 139, 149, 151, 157, 163, 167, 173, 179, 181, 191, 193, 197, 199, 211, 223, 227, 229, 233, 239, 241, 251, 257, 263, 269, 271, 277, 281, 283, 293, 307, 311, 313, 317, 331, 337, 347, 349, 353, 359, 367, 373, 379, 383, 389, 397, 401, 409, 419, 421, 431, 433, 439, 443, 449, 457, 461, 463, 467, 479, 487, 491, 499, 503, 509, 521, 523, 541, 547, 557, 563, 569, 571, 577, 587, 593, 599, 601, 607, 613, 617, 619, 631, 641, 643, 647, 653, 659, 661, 673, 677, 683, 691, 701, 709, 719, 727, 733, 739, 743, 751, 757, 761, 769, 773, 787, 797, 809, 811, 821, 823, 827, 829, 839, 853, 857, 859, 863, 877, 881, 883, 887, 907, 911, 919, 929, 937, 941, 947, 953, 967, 971, 977, 983, 991, 997 | 1, 2, 3, 5, 8, 13, 21, 34, 55, 89, 144, 233, 377, 610, 987 |

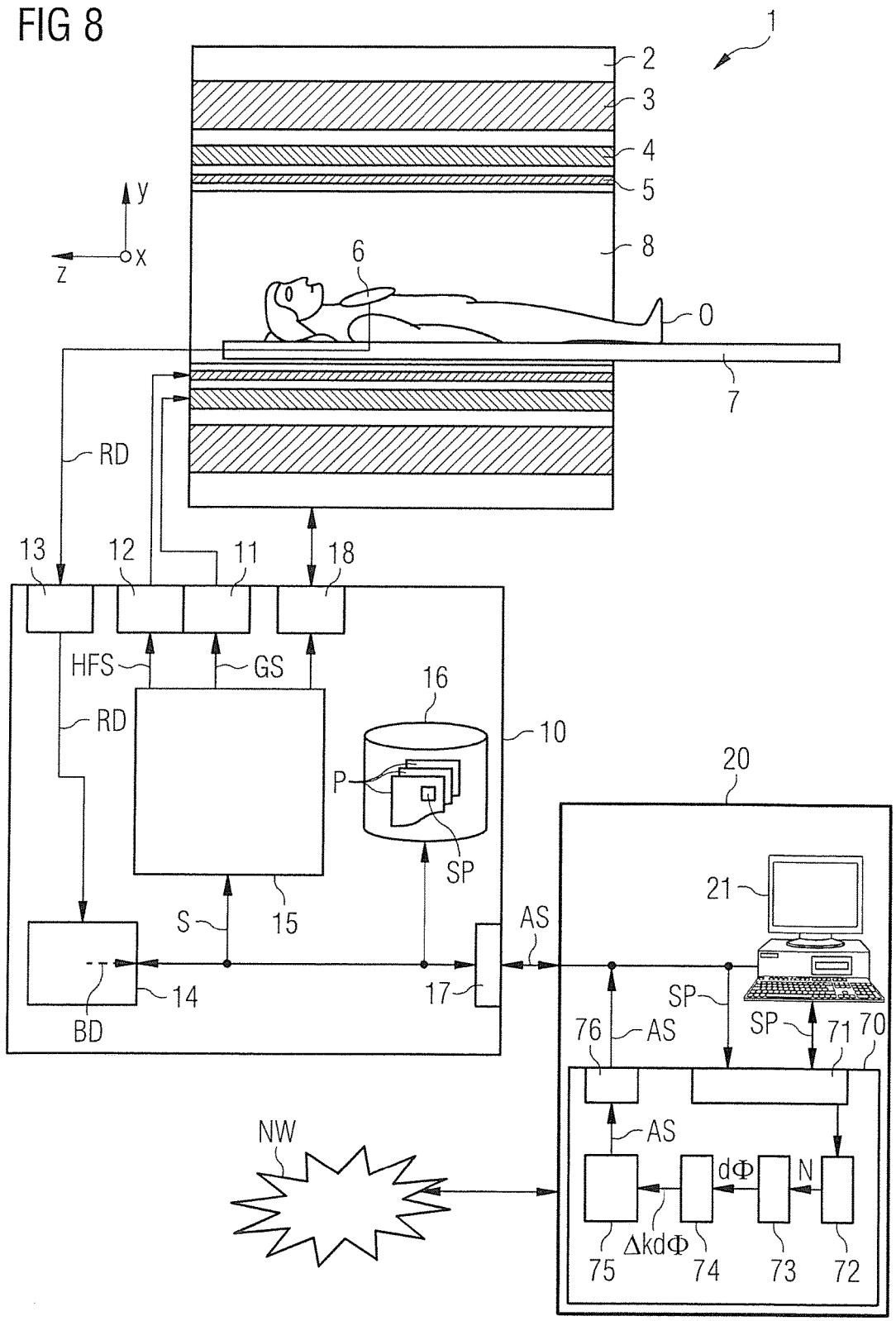

DYNAMIC METHOD AND APPARATUS FOR RADIAL ACQUISITION OF MAGNETIC RESONANCE DATA

BACKGROUND OF THE INVENTION

Field of the Invention

The invention relates to a method for determining a radial k-space trajectory for a magnetic resonance (MR) control sequence, and to an MR control sequence having a radial k-space trajectory. The invention furthermore relates to a method for operating a magnetic resonance system. The invention additionally relates to an MR control sequence having a radial k-space trajectory. The invention also relates to a control sequence determination device for determining a radial k-space trajectory of an MR control sequence. The invention further relates to a magnetic resonance system.

Description of the Prior Art

Dynamic contrast-enhanced magnetic resonance imaging (DCE-MRI) is a technique in which the inflow of a contrast agent into a tissue that is to be examined is observed as a function of time. During this process, multiple image datasets of the tissue that is to be examined are calculated at different times. The optimal times are not known in advance because the time between injection of the contrast agent and arrival of the contrast agent in the target tissue varies according to patient.

Various methods have been developed in conventional dynamic MR imaging in order to synchronize the acquisition of the contrast-determining k-space regions with the arrival of the contrast agent in the target tissue during the sampling or readout of raw data. They include starting the measurement based on empirical values, additional test measurements in order to determine the arrival time, and real-time sequences for detecting the arrival in an afferent vessel. Each of these methods has advantages and disadvantages.

Radial imaging with a temporal variation of the projection angles that are based on the golden section permits the times at which images are reconstructed to be specified only after the data acquisition, and it therefore gets by without the aforementioned methods. The advantage achieved by means of the radial acquisition technique is that each spoke acquires information from the contrast-determining central k-space regions. Such an approach is illustrated in FIG. 2. In conventional Cartesian imaging, however, the central rows determining the contrast are acquired at a specific time instant during the measurement. Incrementing the azimuthal spoke angle of 111.25° (known as the golden angle) between spokes succeeding one another in time allows an arbitrary window of $N_w$ sequentially measured spokes to be achieved that covers k-space approximately uniformly, and as a result an isotropically resolved image can be calculated from the spokes belonging to the window. The golden angle in the unit radians (unit symbol: rad) is yielded from the quotient of the number it and the golden number $$\gamma = \frac{\sqrt{5}+1}{2}.$$

In this case the golden number results from the quotient a/b of a line segment having the subsegments a and b which is divided by the golden section.

In non-dynamic radial imaging, in contrast, a total number N of spokes is initially determined in such a way that N azimuthally uniformly distributed spokes just cover k-space of a desired size (i.e. a desired amount of k-space) sufficiently in accordance with the Nyquist-Shannon theorem. Accordingly, an angular increment $d\Phi=\pi/N$ between adjacent spokes in k-space is specified by the number N. The increment $d\Phi$ is e.g. likewise chosen as the angular increment between spokes measured sequentially in time, such that k-space is uniformly and adequately covered after precisely N profiles.

In early dynamic radial methods, the k-space was acquired in n cycles. Within each cycle, the angle between successively measured spokes was incremented by $n \cdot d\Phi$ each time. The number of time instants at which isotropically resolved images can be calculated is increased by a factor n as a result. However, the full flexibility of the golden scheme in respect of the choice of the time windows is not achieved by that means. Such a method is illustrated in FIG. 1.

However, the golden angle as angular increment is also associated with a series of disadvantages compared to the angular increment $d\Phi$. The most serious of said disadvantages is that the number of spokes required when using the golden angle scheme in order to cover k-space of a given size just sufficiently in accordance with the Nyquist-Shannon sampling theorem is generally substantially greater than the corresponding number of spokes when using a scheme having a constant angular increment between adjacent spokes in the k-space. The actual number of spokes N used for the reconstruction of an image determines the temporal resolution of the dynamic technique. Thus, if the number of spokes N is chosen such that k-space is just sufficiently covered according to the Nyquist-Shannon sampling theorem, then the temporal resolution decreases when using the golden angle scheme compared to the temporal resolution when using a scheme having a constant angular increment between adjacent spokes in the k-space. It is frequently the case in dynamic imaging that images are calculated from time windows which are too short for acquiring the number of spokes required by the Nyquist-Shannon sampling theorem in order to achieve a desired temporal resolution. In this case the degree of undersampling when using the golden angle scheme is greater than when using a scheme having a constant angular increment between adjacent spokes in the k-space. Accordingly, artifacts in consequence of the undersampling are therefore worse.

SUMMARY OF THE INVENTION

An object of the present invention is to provide a more effective radial acquisition scheme for DCE-MRI offering better temporal and spatial resolution which, like the golden angle scheme, permits isotropically resolved images to be calculated at arbitrary, retrospectively specified time instants.

In the inventive method for determining a radial k-space trajectory of an MR control sequence, a first whole number is selectively picked out initially from a first subset of whole numbers. To put it another way, the first whole number is not selected at random or arbitrarily. Firstly, it is critical that the selected number is a whole number. Furthermore, the first whole number is chosen in accordance with certain requirements in terms of spatial and temporal resolution. For example, the temporal resolution is determined by the size of a readout window, and the spatial resolution by specific requirements in respect of the visualization of the examination subject that is to be acquired. A first constant angular increment between spokes of the radial k-space trajectory that are adjacent in the k-space is subsequently determined as the quotient of the number $\pi$ and the first whole number. In addition, a second constant angular increment between spokes of the radial k-space trajectory measured sequentially in time is determined as the product from a second whole number and the first constant angular increment, wherein the second whole number is determined from a second subset of whole numbers. In this case the first subset of whole numbers and/or the second subset of whole numbers are/is the set of prime numbers. The latter is critical to ensure that none of the spokes is measured twice in an arbitrary interval of a number of successive measurements corresponding to the first whole number. What is to be understood hereinbelow as the k-space trajectory is the temporal sequence of the sampling points of a pulse sequence in the spatial frequency domain (k-space), that is to say, for example, a plurality of k-space spokes that are part of a sampling pattern in k-space.

An idea underlying the method according to the invention is based on the knowledge that, in comparison with the Fibonacci numbers that are critical in the case of the method in the prior art, the prime numbers lie much closer together, as is illustrated in a table in FIG. 6. Thus, according to the invention, a specific spatial resolution is achieved already with a lower number of sampled k-space spokes. According to the invention, for example, the Nyquist-Shannon sampling theorem is already fulfilled with the sampling of a lower number of k-space spokes.

In the inventive method for operating a magnetic resonance system, a radial k-space trajectory for a magnetic resonance control sequence is initially determined and then the magnetic resonance system is operated using said magnetic resonance control sequence. In this case the inventive method for determining a radial k-space trajectory of an MR control sequence is applied in the determination of the radial k-space trajectory.

The MR control sequence according to the invention has a radial k-space trajectory having a first constant angular increment between spokes of the radial k-space trajectory that are adjacent in k-space, the angular increment being yielded from the quotient of $\pi$ and a first whole number from a first subset of whole numbers. The MR control sequence has a second constant angular increment between spokes of the radial k-space trajectory that are measured sequentially in time, said angular increment resulting from the product from a second whole number and the first constant angular increment. In this case the second whole number is a number from a second subset of whole numbers, wherein the first subset of whole numbers and/or the second subset of whole numbers are/is the set of prime numbers.

The inventive control sequence determination device for determining a radial k-space trajectory of an MR control sequence has an input interface for the acquisition of data of an MR control sequence. It additionally has a selection unit (processor) designed to selectively extract (select) a first whole number from a first subset of whole numbers. The inventive control sequence determination device furthermore has a first determination unit (processor) that is designed to determine a first constant angular increment between spokes of the radial k-space trajectory that are adjacent in k-space as the quotient of $\pi$ and the first whole number. The control sequence determination device further has a second determination unit (processor) that is designed to determine a second constant angular increment between spokes of the radial k-space trajectory that are measured sequentially in time as the product from a second whole number and the first constant angular increment, wherein the second whole number is determined from a second subset of whole numbers, wherein the first subset of whole numbers and/or the second subset of whole numbers are/is the set of prime numbers. The determined first and second angular increments are transferred to a control sequence determination unit (processor) that is designed to determine a control sequence on the basis of the determined first and second angular increments.

The determined control sequence is finally output via an output interface.

The inventive magnetic resonance system includes the inventive control sequence determination device.

Parts of the inventive device, in particular the selection unit, the first determination unit and the second determination unit, can be realized wholly or in part in the form of software modules in a processor of a corresponding control device of a magnetic resonance system. This is advantageous insofar as already existing control devices can also be retrofitted by means of a software installation in order to perform the inventive method. The invention therefore also encompasses a non-transitory, computer-readable data storage medium that can be loaded directly into a processor of a programmable control device of a magnetic resonance system, the storage medium being encoded with programming instructions (program code) that causes all the steps of the inventive method to be implemented when the program code is executed in the control device.

In a preferred variant of the method according to the invention, the number from the second subset of whole numbers that is closest to the quotient from the first whole number and the golden number is selected as the second whole number. What is achieved in this way is that an arbitrary window of sequentially measured spokes covers the k-space approximately uniformly and as a result an approximately isotropically resolved image can be calculated from the spokes belonging to the window.

Preferably, the first whole number is the smallest number from the first subset of whole numbers with which k-space, calculated according to a predefined spatial resolution, can be sufficiently densely sampled while fulfilling the Nyquist-Shannon theorem. By fulfilling this condition, it is ensured that an undersampling is avoided during an acquisition of a number of spokes of the sampling pattern corresponding to the first whole number.

Alternatively, the first whole number is the largest number from the first subset of whole numbers which fulfills the condition that the product from the first whole number and a time interval between successive measurements is less than a predefined temporal resolution. In this case, the first whole number is chosen specifically so that a full sampling, i.e. a sampling of N spokes of the sampling pattern, can be performed within a time period that is available for the acquisition of an image. In this case, given a possibly very high temporal resolution, an undersampling can also be accepted. Finally, depending on the specific requirement, a compromise will be chosen between maximally good temporal resolution and a minimization of artifacts due to an undersampling.

In a special variant, the second whole number can be less than the quotient from the first whole number and the golden number. In this case the second constant angular increment is somewhat less than the golden angle.

In an alternative variant, the second whole number can be greater than the quotient from the first whole number and the golden number. With this variant, the second constant angular increment is somewhat greater than the golden angle.

BRIEF DESCRIPTION OF THE DRAWINGS

FIG. 3 is a flowchart illustrating the inventive method for determining a radial k-space trajectory of an MR control sequence.

FIG. 4 shows the distribution of the spokes in the k-space in the case of a sampling method according to a first exemplary embodiment of the invention.

FIG. 6 is a table contrasting the prime numbers with the Fibonacci numbers.

FIG. 8 is a schematic illustration of a magnetic resonance system according to the invention.

DESCRIPTION OF THE PREFERRED EMBODIMENTS

Figure 1:
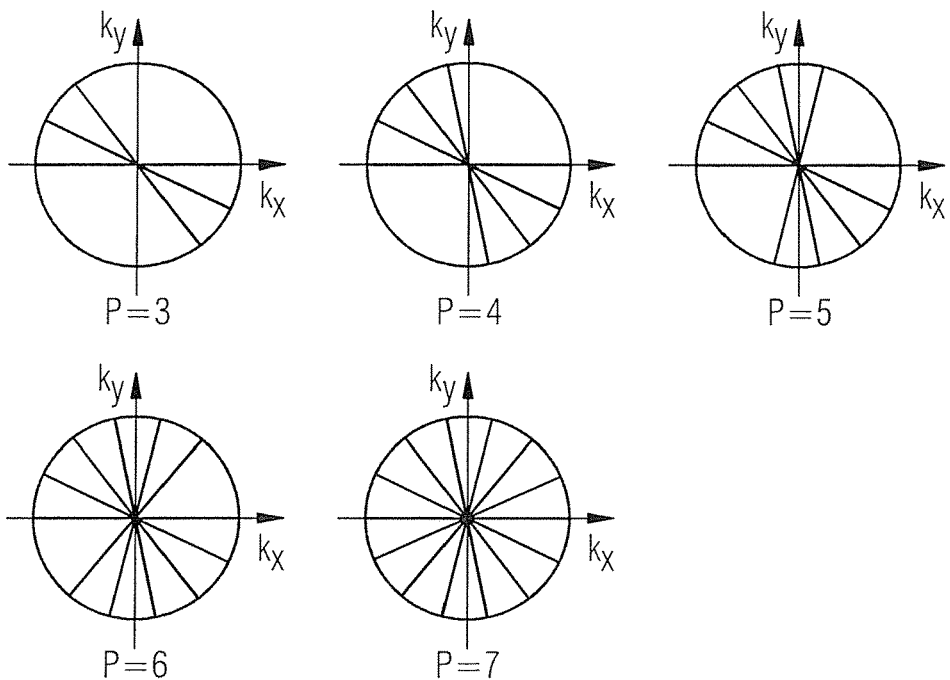
FIG. 1 shows the distribution of the spokes in k-space in the case of a conventional sampling technique with constant angular increment.

FIG. 1 illustrates a distribution of the spokes in k-space in the case of a conventional radial sampling method for a total number of N=7 spokes when a classical scheme having a constant angular increment of $d\Phi=\pi/N$ is used. The following holds therein:

$$\Phi_p = \Phi_1 + (p-1) \cdot d\Phi = \Phi_1 + (p-1) \cdot (\pi/N), \quad (1)$$

wherein $\Phi_p$ is the sampling angle at time instant p. The time instants p=3, ..., 7 are shown. The distribution of the spokes is not uniform for all time instants p<7. The distribution of the spokes is optimal for p=7.

Figure 2:
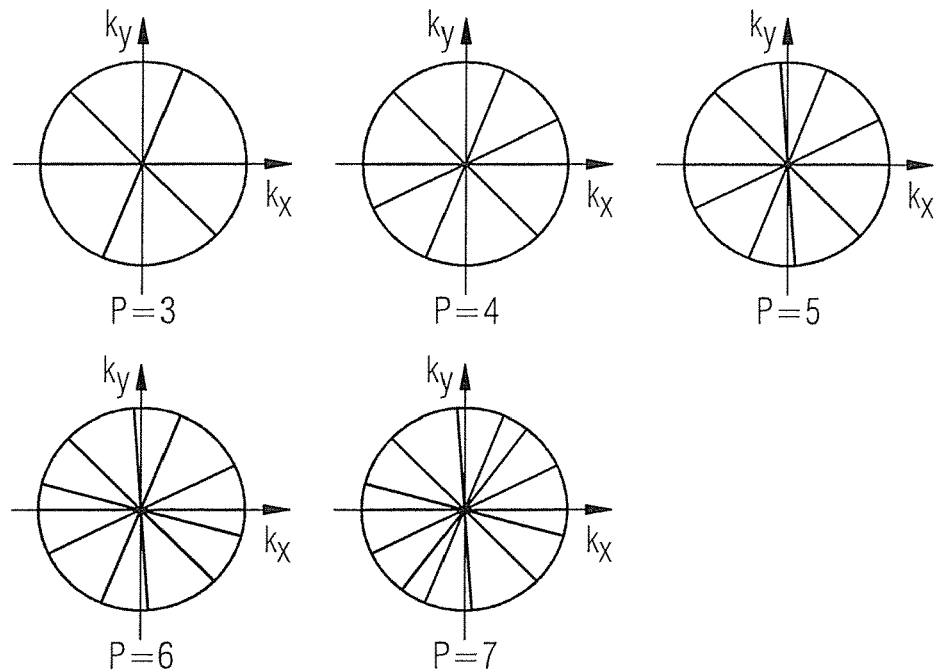
FIG. 2 shows the distribution of the spokes in k-space in the case of a sampling method using the golden angle as the angular increment.

FIG. 2 shows the corresponding distribution of the spokes when a conventional golden angle scheme is used. The angular increment is $\Phi_{golden}$. The golden angle (in rad) is yielded from the quotient of the number π and the golden number γ. The following therefore holds:

$$\Phi_p = \Phi_1 + (p-1) \cdot \Phi_{golden}, \quad (2)$$

The distribution of the spokes is relatively uniform for all time instants, in particular when p is a Fibonacci number (p=3 and p=5). For p=7, the distribution is not optimal, which leads to a greater maximum angle between adjacent spokes. If the total number N was chosen such that the Nyquist limit is just fulfilled for N=7 spokes and a uniform distribution of the angles, the Nyquist limit is still undershot at time instant p=7, since, of course, no exactly uniform distribution of the spokes is present with this variant.

FIG. 3 shows a flowchart which illustrates the inventive method 300 according to a first exemplary embodiment: First, in a step 3.I, a prime number N, which specifies the number of different azimuthal angles, is selectively picked out. Various criteria can be applied for the choice of the prime number. If k-space is to be sampled, for example, so that no aliasing artifacts occur, then the smallest prime number N which is just greater than the uniform Nyquist limit can be selected for a given matrix size M:

$$N \geq \pi/2 \, M \quad (3)$$

In another scenario, the number of spokes which can be measured in a time window of predefined duration can be determinant for the choice of the prime number N.

In a step 3.II, the angle between adjacent spokes is specified by means of the number N:

$$d\Phi = \pi/N \quad (4)$$

In a step 3.III, the angle lying on the dΦ grid that comes closest to the golden angle $$\Phi_{golden} = 180/\gamma \sim 111.25° \quad (5)$$

is chosen as the increment between spokes measured sequentially in time.

Let Δk be the integral number of angular increments dΦ between successively measured spokes:

$$\Phi_{i+1} = \Phi_i + \Delta k \, d\Phi \quad (6)$$

Here, $\Phi_i$ specifies the angle of the spoke which is measured at the i-th measurement time instant. Δk is therefore calculated as follows:

$$\Delta k = IMULT((\Phi_{golden}/d\Phi) = IMULT((\pi/\gamma)/(\pi/N)) = IMULT(N/\gamma) \quad (7)$$

In this case IMULT( ... ) means that the expression in parentheses is to be rounded to the nearest whole number.

The above-described scheme has the following characteristics:

M1: The sequence $\Phi_i$ is repeated after precisely N measurements.

M2: None of the spokes is measured twice in an arbitrary interval of N successive measurements.

The first characteristic M1 follows immediately by inserting formula 4 into formula 6:

$$\Phi_{i+N} = \Phi_i + N \cdot \Delta k \, d\Phi = \Phi_i + N \cdot \Delta k (\pi/N) = \Phi_i + \Delta k \cdot \pi \quad (8)$$

The angle of the (i+N)-th measurement therefore differs from the angle of the i-th measurement by an integral multiple of the circle constant π and is consequently identical on account of the periodicity of the azimuth angle.

The second characteristic M2 is not immediately clear and can be proven as follows: Firstly it is assumed that there are two measurements i and j, the temporal distance (i-j) between which is less than N and which measure the same spoke. Without loss of generality it can be assumed in this case that i>j, i.e. the i-th measurement is performed after the j-th. The following would therefore apply:

$\Phi_i = \Phi_j + n \cdot \pi$, with integral $n$.

$\rightarrow i \cdot \Delta k \, d\Phi = j \cdot \Delta k \, d\Phi + n \cdot \pi$ $\rightarrow (i-j) \cdot \Delta k \, d\Phi = n \cdot \pi$ $\rightarrow (i-j) \cdot \Delta k \, \pi/N = n \cdot \pi$ $\rightarrow (i-j) = n \cdot N/\Delta k \quad (9)$ To ensure the last equation is fulfilled for (i-j)<N, n·N must be divisible by Δk. Since N is a prime number, this is only possible if either N or n is divisible by Δk. As a prime number, however, N is only divisible by 1 and N and consequently drops out. If the whole number n is divisible by Δk, then (i-j) is an integral multiple of N. This contradicts the assumption (i-j)<N. q.e.d.

In order to prove the deciding characteristic M2, use is therefore made of the fact that N is a prime number. The advantages of the method according to the invention compared to the method using the angular increment $\Phi_{golden}$ result from the fact that the prime numbers lie much closer together than the Fibonacci numbers (see table in FIG. 6). Accordingly, a given k-space can generally be covered sufficiently densely by a smaller number of spokes in order to calculate an artifact-free image. The temporal resolution of the dynamic technique is increased as a result. Alternatively, given intentional undersampling of the k-space in order to achieve a predefined temporal resolution, artifacts resulting from said undersampling are reduced, because the undersampling is minimized in the method according to the invention.

For typical matrix sizes M, however, the angle $\Delta k \cdot d\Phi$ deviates by only fractions of a degree from the true golden angle $\Phi_{golden}$. Although this is not proven with mathematical rigor herein, it can therefore be assumed that the inventive method—similarly to the true golden angle method—uniformly covers the k-space in any arbitrary time interval.

The advantages of the inventive method just cited are illustrated in the following for the matrix size 256 that is typical in MR imaging:

To ensure adequate coverage of a circular k-space whose diameter corresponds to the edge length of a 256 matrix wherein M=256 in Cartesian imaging, M·π/2 spokes are required, i.e. approximately 402 in the case of a uniform angular distance between adjacent spokes. The smallest prime number greater than 402 is the number 409 (see table in FIG. 6). The inventive method can therefore be performed using an angular increment $d\Phi = \pi/409 \sim 0.44°$ between adjacent spokes in the k-space. From (5), the number $\Delta k$ is yielded as: $\Delta k = IMULT(409/\gamma) = IMULT(252.78) = 253$. From this, there results an angular increment of 253 π/409~111.34° for spokes measured sequentially in time. The deviation from the golden angle $\Phi_{golden} \sim 111.25°$ is therefore less than one tenth of a degree. In contrast, the gain in temporal resolution compared to the method using the true golden angle is dramatic: The smallest Fibonacci number greater than 402 is the number 610. In the prior art it is therefore necessary to fill the periphery of the k-space with 610 spokes succeeding one another in time in order to calculate an artifact-free image. With the method according to the invention, only 409 consecutive spokes are required. The temporal resolution is therefore increased by a factor ~1.5.

FIG. 4 shows the corresponding distribution of the spokes when using the inventive method according to a first exemplary embodiment. In this case N is specified as prime number=7. The small number 7 serves merely for greater simplicity of illustration. For N=7, one obtains $\Delta k = 4$ according to (7); the following therefore applies:

$$\Phi_p = \Phi_1 + (p-1) \cdot \Delta k \cdot d\Phi = \Phi_1 + (p-1) \cdot 4 \cdot (\pi/N). \quad (10)$$

The angular increment between successively measured spokes therefore amounts to 4×(180°/7)~102.86°. For time instants p=3 to p=6, the distribution of the spokes is somewhat less uniform than for the golden scheme in FIG. 2, but substantially more uniform than for the classical scheme in FIG. 1. For p=7, the distribution is optimal and consequently fulfills the Nyquist limit under the cited preconditions. It should be mentioned that the somewhat less uniform distribution for time instants p<7 compared to the golden scheme is a consequence of the relatively great deviation of the angular increment 102.86° from the golden angle (111.25°). However, this great deviation is a consequence of the small total number of N=7 spokes chosen for technical drawing reasons. For a realistic number of spokes N in the order of magnitude of 309 spokes, the deviation is in the order of one tenth of a degree, in other words minimal.

Figure 5:
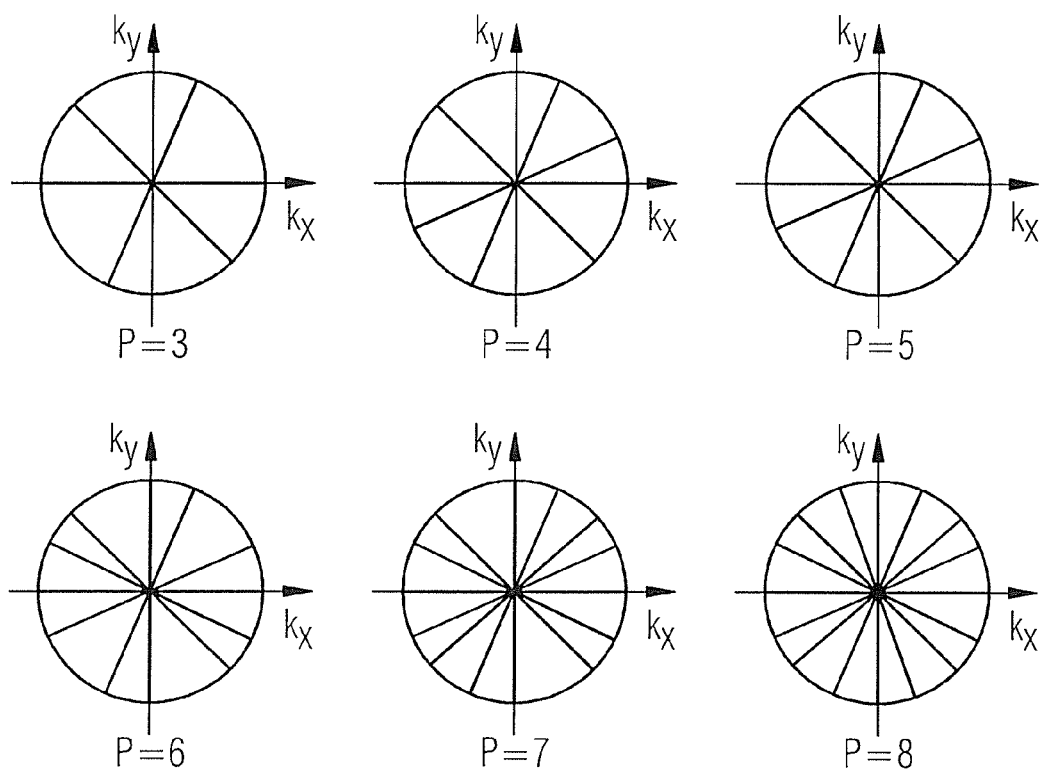
FIG. 5 shows the distribution of the spokes in the k-space in the case of a sampling method according to a second exemplary embodiment of the invention.

In a second exemplary embodiment, which is illustrated in FIG. 5, use is made of the fact that the features M1 and M2 are also fulfilled when N is an arbitrary whole number (i.e. not necessarily a prime number) and instead $\Delta k$ is a prime number. This is likewise immediately apparent from the proof shown above. If, analogously to the above-described example, N=402 is chosen for example, then $\Delta k = 251$ is the prime number that comes closest to the rational number $$\frac{2 \cdot N}{\sqrt{5} + 1} \approx 248.45.$$

The angular increment between successively measured spokes is thus $\Delta k \cdot (180°/N) = 251 \cdot (180°/402) \sim 112.39$ and therefore deviates by more than one degree from the golden angle. FIG. 5 schematically shows the method according to a second exemplary embodiment having a low total number of spokes. Here, the total number of spokes is N=8, i.e. not a prime number. In its place, a prime number is chosen as $\Delta k$, and moreover such that $\Delta k \cdot d\Phi$, wherein $d\Phi = 180°/8 = 22.5°$, comes closest to the golden angle, i.e. $\Delta k = 5$. The angular increment is therefore $5 \cdot (180°/8) = 112.5°$ and the following applies:

$$\Phi_p = \Phi_1 + (p-1) \cdot 5 \cdot d\Phi = \Phi_1 + (p-1) \cdot 5 \cdot 180°/8. \quad (11)$$

Due to the relatively small deviation from the golden angle, the distribution of the spokes for p=1, . . . , 7 is relatively uniform, and for p=8 in turn optimal. None of the spokes is measured twice in the time interval p=1, . . . , 8, i.e. the feature M2 is fulfilled.

In FIG. 6, the distribution of the prime numbers PZ is shown in contrast to the distribution of the Fibonacci numbers FZ. The significantly smaller distances between the prime numbers are a reason why significantly fewer sampling points need to be acquired with the method according to the invention.

Figure 7:
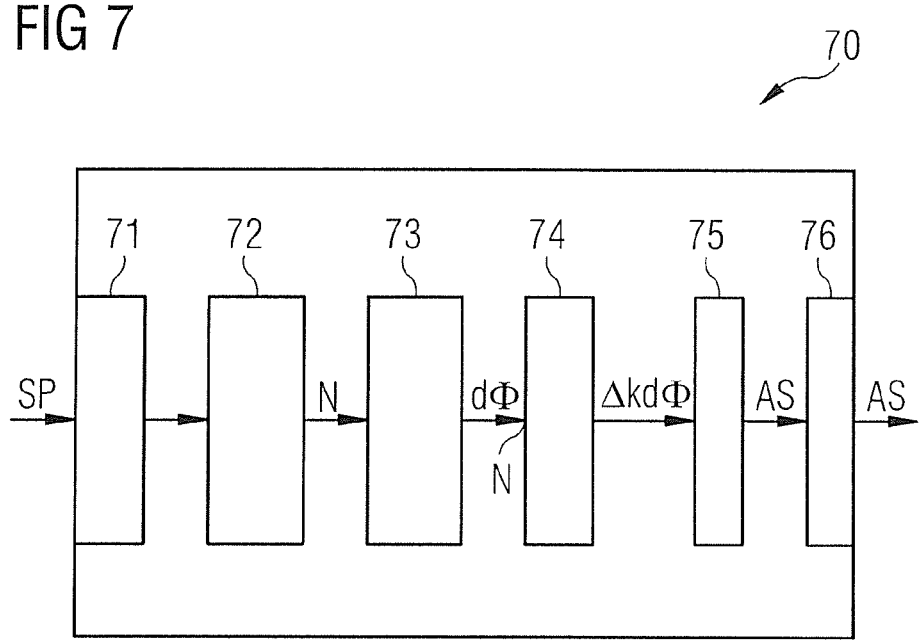
FIG. 7 is a schematic illustration of a control sequence determination device according to the invention.

In FIG. 7, a schematic illustration of a control sequence determination device 70 according to an exemplary embodiment of the invention is presented. The control sequence determination device 70 comprises an input interface arrangement 71 for the acquisition of data of an MR control sequence. The acquired data can have, for example, a pulse sequence or specific characteristics of the pulse sequence, such as e.g. the echo time, the repetition time, the gradient moments, the temporal length of the readout windows, the time between the individual measurements, etc. The acquired data is transferred to a selection unit 72, which now selects a first whole number N from a first subset TM1 of whole numbers on the basis of the acquired data. This can be done, for example, on the basis of the length of the readout window, or taking into account the Nyquist-Shannon sampling theorem. The first whole number N selected is transferred to a first determination unit 73 which is embodied for determining a first constant angular increment $d\Phi$ between spokes of the radial k-space trajectory that are spatially adjacent in the k-space as the quotient of π and the first whole number N. On the basis of the first whole number N and the determined angular increment, a second determination unit 74 determines a second constant angular increment $\Delta k \cdot d\Phi$ between spokes of the radial k-space trajectory that are measured sequentially in time. The second constant angular increment $\Delta k \cdot d\Phi$ is yielded from the product from a second whole number $\Delta k$ and the first constant angular increment $d\Phi$, wherein the second whole number $\Delta k$ is determined for example as the number from a second subset TM2 of whole numbers which lies closest to the quotient from the first whole number N and the golden number γ: It is critical in this case that the first subset TM1 of whole numbers and/or the second subset TM2 of whole numbers are/is the set of prime numbers so as to ensure that none of the spokes is measured twice in an arbitrary interval of N succeeding measurements. A control sequence AS is determined by a control sequence determination unit 75 on the basis of the determined parameters and output via an output interface 76.

FIG. 8 schematically depicts a magnetic resonance system according to the invention. The system includes the actual magnetic resonance scanner 2 having an examination chamber 8 or patient tunnel contained therein. A bed 7 can be introduced into the patient tunnel 8 so that during an examination a patient O or test subject recumbent thereon can be placed at a specific position within the magnetic resonance scanner 2 relative to the magnet system and radiofrequency system arranged therein or, as the case may be, can also be moved between different positions during a measurement.

Included among the components of the magnetic resonance scanner 2 in this case are a basic field magnet 3, a gradient system 4 comprising magnetic field gradient coils for generating magnetic field gradients in the x-, y- and z-directions, and a whole-body radiofrequency coil 5. The magnetic field gradient coils in the x-, y- and z-direction (spatial coordinate system) can be driven independently of one another, such that it is possible, by a predefined combination, to apply gradients in any logical spatial directions, for example in a slice selection direction, in a phase encoding direction or in a readout direction, which do not necessarily lie parallel to the axes of the spatial coordinate system. Magnetic resonance signals induced in the examination subject O can be received via the whole-body coil 5, by means of which the radiofrequency signals for inducing the magnetic resonance signals are generally also transmitted. Usually, however, said signals are received by means of a local coil array 6 composed of local coils (only one of which is shown here) placed for example on or under the patient O. All of these components are generally known to the person skilled in the art and therefore are represented only in roughly schematic form in FIG. 8.

The components of the magnetic resonance scanner 2 are actuated by a control device 10. The latter can be a control computer which may be formed by multiple individual computers, which may also be spatially separated and interconnected via suitable cables or the like. The control device 10 is connected via a terminal interface 17 to a terminal 20 via which an operator is able to control the entire system 1. In the present case, said terminal 20 comprises a computer 21 having a keyboard, one or more screens and further input devices such as a mouse or the like, for example, or is embodied as such a computer 21 such that a graphical user interface is available to the operator.

The control device 10 has, among other components, a gradient control unit 11, which in turn may consist of a number of subcomponents. Control signals are applied to the individual gradient coils by way of said gradient control unit 11 in accordance with a gradient pulse sequence GS. The pulses concerned here are, as described above, gradient pulses which during a measurement are set at precisely designated positions with respect to time and with a precisely predefined time characteristic.

In addition, the control device 10 has a radiofrequency transmitter unit 12 in order to inject radiofrequency pulses into the whole-body radiofrequency coil 5 in each case in accordance with a predefined radiofrequency pulse sequence HFS of the control sequence AS. The radiofrequency pulse sequence HFS comprises the aforementioned selective excitation pulses. The magnetic resonance signals are then received with the aid of the local coil array 6, and the raw data RD received thereby is read out by an RF receiver unit 13 and processed. Following demodulation and digitization, the magnetic resonance signals are passed on in digital form as raw data RD to a reconstruction unit 14, which reconstructs the image data BD therefrom and stores said image data in a storage medium 16 and/or transfers it via the interface 17 to the terminal 20 so that it can be viewed by the operator. The image data BD can also be exported and stored at other locations via a network NW and/or displayed and evaluated. Alternatively, a radiofrequency pulse sequence can also be transmitted via the local coil array and/or the magnetic resonance signals can be received by the whole-body radiofrequency coil (not shown).

Control commands to other components of the magnetic resonance scanner 2, such as e.g. the couch 7 or the basic field magnet 3, are transmitted or measured values or other information are received via a further interface 18.

The gradient control unit 11, the RF transmitter unit 12 and the RF receiver unit 13 are in each case actuated in a coordinated manner by a measurement control unit 15, which responds to commands in a control sequence AS that cause the desired gradient pulse sequence GS and radiofrequency pulse sequence HFS of the control sequence AS to be activated. In addition, it must be ensured that the magnetic resonance signals at the local coils of the local coil array 6 are read out at the appropriate point in time by the RF receiver unit 13 and processed further, i.e. readout windows must be set by e.g. switching the ADCs of the RF receiver unit 13 to receive. The measurement control unit 15 also controls the interface 18.

The basic workflow sequence of such a magnetic resonance measurement and the cited control components are well-known to those skilled in the art, so they need not be discussed in any further detail herein. Such a magnetic resonance scanner 1 and the associated control device 10 may also include other components, which are likewise not explained in detail here. The magnetic resonance scanner 2 can also be implemented in a different design, for example having a patient chamber that is open at the side, or as a smaller scanner in which only a part of the body can be positioned.

In order to start a measurement, an operator can typically select, by way of the terminal 20, a control protocol P provided for said measurement from a storage medium 16 in which a number of control protocols P for different measurements are stored. Said control protocol P contains, inter alia, various control parameters SP for the respective measurement. The control parameters SP include e.g. the sequence type, the target magnetizations for the individual radiofrequency pulses, echo times, repetition times, the various selection directions, etc.

All of these control parameter values SP are made available, inter alia, via an input interface 71 to a control sequence determination device 70 so that the latter will determine an appropriate control sequence AS. Equally, the control parameter values SP can also be initially presented to the operator for acceptance when said protocol is invoked, and the operator can also vary the values as desired with the aid of the user interface and match them to the current examination order. In particular, the operator can in this case also modify the control parameter values SP in the protocol P by way of the computer 21 of the terminal 20 by means of the associated graphical user interface. This is indicated in FIG. 1 by the interface arrangement 71 or by the arrow between the interface 71 and the computer 21.

Alternatively, the operator can also download control protocols containing corresponding control parameter values SP via a network NW, for example from a manufacturer of the magnetic resonance system, instead of retrieving them from the storage medium 16, and then use these as described below.

Based on the control parameter values SP, a control sequence AS is then determined by the control sequence determination device 70 and the control of the remaining components is ultimately effected by the measurement control unit 15 in accordance with said sequence. This control sequence comprises a pulse sequence corresponding to a radial sampling scheme which conforms to the schemes shown in FIG. 4 or 5. As mentioned, the control sequence AS is calculated in a control sequence determination device 70, which is shown as part of the terminal 20, and passed via a control sequence output interface 76 to the control device 10 of the magnetic resonance scanner 2. The control sequence determination device 70 comprises a selection unit 72, a first determination unit 73, a second determination unit 74 and a sequence determination unit 75, which have the functions described in the explanation relating to FIG. 7. The entire control sequence determination device 70 and its components can be realized for example in the form of software by means of which the method according to the invention can be performed on one or more suitable processors.

As mentioned several times, the primary advantage of the method according to the invention compared to the golden angle scheme in the prior art is that in general fewer spokes are required in order to cover k-space of a given size sufficiently in accordance with the Nyquist-Shannon sampling theorem. Accordingly, the new scheme permits the temporal resolution of the dynamic technique to be increased or, as the case may be, artifacts produced as a consequence of azimuthal undersampling to be reduced. The angle between spokes measured sequentially in time deviates only slightly from the corresponding angle in the golden angle scheme. What is achieved thereby is that the main advantage of the golden angle scheme is preserved. The primary advantage is that the spokes measured in an arbitrary, retrospectively specified time window cover k-space as given relatively uniformly.

Further advantages of the method according to the invention compared to the golden angle method result from the following state of affairs. During the image reconstruction, non-Cartesian acquisition methods generally require a function known as density compensation. In density compensation, it is taken into account that k-space is not sampled uniformly. For a radial acquisition scheme having a constant angular increment dΦ between adjacent spokes, this is known exactly. In the method according to the invention, this exact density compensation can therefore be utilized if e.g. images are to be calculated from N spokes measured sequentially in time. With the golden angle scheme, in contrast, the angle between adjacent spokes in k-space varies. It is therefore not possible to resort to the known density compensation. Rather, this must be determined approximately using other methods (a large number of which are known in the prior art). This determination process costs computing time. Moreover, the result is usually not exact. The quality of the computed images is also dependent on the quality of the density compensation.

During the reconstruction of the data, furthermore, the data points measured in k-space are frequently interpolated on a Cartesian grid. In a gridding reconstruction, as it is called, numeric factors required during the interpolation are preferably calculated in advance and stored in tables in order to avoid repeated recalculation (e.g. for different receive coils or time instants). The size of these tables (and consequently the storage space required, as well as the numeric overhead involved in calculating the same) is dependent among other factors on the number of different azimuthal angles. In the method according to the invention, these are precisely N. With a golden angle method, all the angles are different, i.e. the number of different angles is equal to the total number of spokes measured. In a time-resolved measurement, the latter is typically substantially greater than N. Accordingly, the storage space requirements and the numeric overhead involved in calculating the tables are higher. Even with storage capacities that are available today, this advantage of the method according to the invention can, e.g. in a time-resolved 3D measurement, also be a discriminator which enables an advance calculation to be made in the first place.

It is noted once again that the methods described in detail in the foregoing and the disclosed control sequence determination device 70 and the magnetic resonance system 1 are merely exemplary embodiments that can be modified in many ways by those skilled in the art without departing from the scope of the invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance (MR) apparatus, said method comprising:

in a processor, determining a radial k-space trajectory comprising spokes for entering raw MR data, to be acquired by operation of said MR apparatus, into a memory at data entry points representing k-space in said memory, by selecting a first whole number N from a first subset of whole numbers, determining a first constant angular increment dΦ between respective spokes of said radial k-space trajectory, which are adjacent in k-space, as a quotient of π and said first whole number N, determining a second constant angular increment Δk*dΦ between respective spokes of said radial k-space trajectory that are to be filled with said MR raw data sequentially in time, as the product of a second whole number Δk and said first constant angular increment dΦ, wherein said second whole number Δk is determined from a second set of whole numbers, and wherein at least one of said first subset of whole numbers and said second subset of whole numbers is the set of prime numbers;

in said processor, generating gradient control signals designed to operate gradient coils of said MR apparatus so as to emit coding gradients that cause said MR data to be entered into said memory along said k-space trajectory with the spokes thereof respectively separated by said second constant angular increment, and incorporating said gradient control signals into a control sequence and generating an electronic signal representing said control sequence; and from said processor, providing said electronic signal representing said control sequence to said MR apparatus and thereby operating said MR apparatus to acquire said raw MR data, with said gradient coils being operated to emit said coding gradients and thereby causing said MR data to be entered into said memory along said k-space trajectory with the spoke thereof respectively separated by said second constant angular increment, in order to compile a data file of k-space data in said memory, and making said data file of k-space data available from said memory in electronic form for further processing.

2. A method as claimed in claim 1 wherein said computer is configured to select Δk from said second subset of whole numbers so as to be closest to the quotient of said first whole number N and the golden number γ.

3. A method as claimed in claim 1 wherein said computer is configured to select said first whole number as the smallest number from said first subset of whole numbers that still causes the Nyquist-Shannon theorem to be satisfied when entering said MR data into said data entry points in k-space with a density in k-space according to a predetermined spatial resolution.

4. A method as claimed in claim 1 wherein said computer is configured to select said first whole number N as the largest number from the first subset of whole numbers that causes the product of the first whole number N and a time interval Δt between successive spokes to be less than a predetermined temporal resolution.

5. A method as claimed in claim 1 comprising, in said processor, implementing said further processing by reconstructing MR image data from said data file of k-space data, and making said MR image data available in electronic form from said processor.

6. A method as claimed in claim 5 comprising, from said processor, causing an MR image represented by said MR image data to be displayed at a display screen in communication with said processor.

7. A magnetic resonance (MR) apparatus comprising:
an MR scanner comprising gradient coils;
a control computer configured to operate the MR scanner, according to an MR control sequence, to acquire MR data from a subject situated in the MR scanner;
an electronic memory comprising a plurality of data entry points at which said control computer is configured to enter said MR data according to a radial k-space trajectory, comprising a plurality of spokes, that is designated in said control sequence;
said computer being configured to determine said control sequence and to designate said radial k-space trajectory therein by selecting a first whole number N from a first subset of whole numbers, determining a first constant angular increment dΦ between respective spokes of said radial k-space trajectory, which are adjacent in k-space, as a quotient of π and said first whole number N, determining a second constant angular increment Δk*dΦ between respective spokes of said radial k-space trajectory that are to be filled with said MR raw data sequentially in time, as the product of a second whole number Δk and said first constant angular increment dΦ, wherein said second whole number Δk is determined from a second set of whole numbers, and wherein at least one of said first subset of whole numbers and said second subset of whole numbers is the set of prime numbers;
said processor being configured to generate gradient control signals designed to operate said gradient coils of said MR apparatus so as to emit coding gradients that cause said MR data to be entered into said memory along said k-space trajectory with the spokes thereof respectively separated by said second constant angular increment, and to incorporate said gradient control signals into a control sequence and to generate an electronic signal representing said control sequence; and
said processor being configured to provide said electronic signal representing said control sequence to said MR scanner and thereby operate said MR scanner to acquire said raw MR data, with said gradient coils being operated to emit said coding gradients and thereby causing said MR data to be entered into said memory along said k-space trajectory with the spoke thereof respectively separated by said second constant angular increment, in order to compile a data file of k-space data in said memory, and to make said data file of k-space data available from said memory in electronic form for further processing.

8. An MR apparatus as claimed in claim 7 wherein said computer is configured to implement said further processing by reconstructing MR image data from said data file of k-space data, and making said MR image data available from said computer in electronic form.

9. An MR apparatus as claimed in claim 8 comprising a display monitor in communication with said computer, and wherein said computer is configured to cause an MR image represented by said MR image data to be displayed at said display monitor.

10. A non-transitory, computer-readable data storage medium encoded with programming instructions, said storage medium being loaded into a computer that determines a control sequence for operating a magnetic resonance (MR) apparatus to acquire MR data, said control sequence comprising a designation of a radial k-space trajectory having a plurality of spokes, and said programming instructions causing said computer to:
select a first whole number N from a first subset of whole numbers;
determine a first constant angular increment dΦ between respective spokes of said radial k-space trajectory, which are adjacent in k-space, as a quotient of π and said first whole number N;
determine a second constant angular increment Δk*dΦ between respective spokes of said radial k-space trajectory that are to be filled with MR raw data sequentially in time, as the product of a second whole number Δk and said first constant angular increment dΦ, wherein said second whole number Δk is determined from a second set of whole numbers, and wherein at least one of said first subset of whole numbers and said second subset of whole numbers is the set of prime numbers;
generate gradient control signals designed to operate gradient coils of said MR apparatus so as to emit coding gradients that cause said MR data to be entered into said memory along said k-space trajectory with the spokes thereof respectively separated by said second constant angular increment, and incorporate said gradient control signals into a control sequence and generate an electronic signal representing said control sequence; and
provide said electronic signal representing said control sequence to said MR apparatus and thereby operate said MR apparatus to acquire said raw MR data, with said gradient coils being operated to emit said coding gradients and thereby causing said MR data to be entered into said memory along said k-space trajectory with the spoke thereof respectively separated by said second constant angular increment, in order to compile a data file of k-space data in said memory, and make said data file of k-space data available from said memory in electronic form for further processing.

11. A data storage medium as claimed in claim 10 wherein said programming instructions cause said computer to implement said further processing by reconstructing MR image data from said data file of k-space data, and to make said MR image data available from said computer in electronic form.

12. A data storage medium as claimed in claim 11 wherein said programming instructions cause said computer to display an MR image represented by said image data at a display screen in communication with said computer.

* * * * *